United States Patent
Anzou et al.

(10) Patent No.: US 7,734,975 B2
(45) Date of Patent: Jun. 8, 2010

(54) SEMICONDUCTOR INTEGRATED CIRCUIT HAVING BUILT-N SELF TEST CIRCUIT OF LOGIC CIRCUIT AND EMBEDDED DEVICE, AND DESIGN APPARATUS THEREOF

(75) Inventors: Kenichi Anzou, Kawasaki (JP); Chikako Tokunaga, Yokohama (JP); Tetsu Hasegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 645 days.

(21) Appl. No.: 11/683,759

(22) Filed: Mar. 8, 2007

(65) Prior Publication Data

US 2007/0226568 A1 Sep. 27, 2007

(30) Foreign Application Priority Data

Mar. 10, 2006 (JP) .............................. 2006-065503

(51) Int. Cl.
*G01R 31/28* (2006.01)
(52) U.S. Cl. ...................................... 714/733; 714/718
(58) Field of Classification Search .................... 714/25, 714/30, 733, 718; 701/29; 365/272; 713/322
See application file for complete search history.

(56) References Cited

U.S. PATENT DOCUMENTS

| | | | | |
|---|---|---|---|---|
| 5,553,236 A | * | 9/1996 | Revilla et al. .................. | 714/25 |
| 6,061,811 A | * | 5/2000 | Bondi et al. .................. | 714/30 |
| 6,556,901 B2 | * | 4/2003 | Sugimura et al. ............. | 701/29 |
| 7,218,566 B1 | * | 5/2007 | Totolos et al. ................ | 365/222 |
| 7,596,708 B1 | * | 9/2009 | Halepete et al. ............. | 713/322 |
| 2005/0097418 A1 | | 5/2005 | Anzou et al. | |
| 2007/0011535 A1 | | 1/2007 | Anzou et al. | |

FOREIGN PATENT DOCUMENTS

JP 2005-031018 2/2005

\* cited by examiner

*Primary Examiner*—David Ton
(74) *Attorney, Agent, or Firm*—Turocy & Watson, LLP

(57) ABSTRACT

A semiconductor integrated circuit contains a logic circuit which operates upon receiving a clock; a logic built-in self test circuit which executes a built-in self test of said logic circuit, said logic built-in self test circuit having a pattern generator which generates a pattern to be input to said logic circuit, a pattern compactor which receives data output from said logic circuit that has received the pattern, compacts the data, and outputs a result, and a logic built-in self test control unit which controls operations of said pattern generator and said pattern compactor and controls an operation of causing a scan path in said logic circuit to shift upon receiving the pattern; a device circuit which operates upon receiving the clock; and a device circuit built-in self test circuit which executes a built-in self test of said device circuit.

16 Claims, 11 Drawing Sheets

US 7,734,975 B2

SEMICONDUCTOR INTEGRATED CIRCUIT HAVING BUILT-N SELF TEST CIRCUIT OF LOGIC CIRCUIT AND EMBEDDED DEVICE, AND DESIGN APPARATUS THEREOF

CROSS REFERENCE TO RELATED APPLICATION

This application is based upon and claims benefit of priority under 35 USC §119 from the Japanese Patent Application No. 2006-65503, filed on Mar. 10, 2006, the entire contents of which are incorporated herein by reference.

BACKGROUND OF THE INVENTION

The present invention relates to a semiconductor integrated circuit and a design apparatus thereof.

One of test facilitation techniques to overcome difficulties in testing large-scale complex semiconductor integrated circuits is a built-in self test (to be referred to as a BIST hereinafter). The BIST is widely used.

In the BIST, a BIST circuit arranged around a test target block in a semiconductor integrated circuit automatically generates a test pattern to be supplied to the test target block and analyzes the test result output from the test target block.

First, a semiconductor integrated circuit including a test target, i.e., a test target block is set in a test mode. In this mode, the input terminals of the test target block receive a test signal which is different from that in the normal operation, and the output terminals feed data also to the BIST logic.

A BIST control circuit to control a BIST circuit is initialized. Then, a predetermined number of BIST clocks are input to execute the BIST. During the BIST, a test pattern generated by a pattern generator is automatically input to the test target block.

A test result analyzer analyzes the test result output from the test target block and outputs an analysis result.

In the BIST, it is unnecessary to prepare a large amount of test patterns on an external tester memory. Hence, the cost of the tester is reduced. All operations are done in the device in synchronism with the BIST clock. The use of a high-speed BIST clock enables a test at a higher operation speed than the test operation clock of the tester. This allows a product test in an actual operation.

In a System-on-Chip (to be referred to as a Soc hereinafter) having a plurality of kinds of functional blocks (IP (Intellectual Property) cores), it is possible to independently test blocks by building a BIST in each of the logic core and memory core. This arrangement also allows to simultaneously test a plurality of blocks and shorten the total test time.

On the other hand, when a plurality of blocks are tested at the same time, power consumption upon the test tends to considerably increase.

Especially in the BIST, generally, the fault detection capability is enhanced by raising the activation efficiency of the circuit as compared to the normal operation mode. For this reason, even when power consumption during the system operation is suppressed below a prescribed value set in design, power consumption during the test may fall outside the guaranteed range of power design and cause an operation error due to voltage drop.

Hence, scheduling to decide the test execution sequence needs to be appropriately done. It is necessary to make the total power consumption of simultaneously executed tests fall within the prescribed range and optimize the test from the viewpoint of power consumption and test time.

However, simple scheduling may be unable to solve the problem of power consumption because when the test circuits of several blocks are being operated, other blocks may operate.

For example, to execute a memory BIST circuit at a high frequency, the timing must be adjusted by using a high-speed clock input during the system operation as the clock of the memory and using the same clock even for the memory BIST circuit.

However, the high-speed clock for the system operation also propagates to a system logic circuit. The logic circuit operates at random so that power consumption is generated in the part other than the test target. If the propagation range spreads, the power consumption of the overall semiconductor integrated circuit becomes too high to neglect.

To prevent this phenomenon, a clock switching circuit to suppress clock input is provided at the system clock diverging point to the logic circuit to prevent clock propagation to it during memory BIST execution.

However, adding a circuit to the high-speed clock path locally delays clock propagation to each path, resulting in an increase in difficulties in timing adjustment and an increase in the design time.

A reference that discloses a conventional BIST circuit is as follows.

Japanese Patent Laid-Open No. 2003-208331

SUMMARY OF THE INVENTION

According to one aspect of the invention, there are provided a semiconductor integrated circuit comprising:

a logic circuit which operates upon receiving a clock;

a logic built-in self test circuit which executes a built-in self test of said logic circuit, said logic built-in self test circuit having a pattern generator which generates a pattern to be input to said logic circuit, a pattern compactor which receives data output from said logic circuit that has received the pattern, compacts the data, and outputs a result, and a logic built-in self test control unit which controls operations of said pattern generator and said pattern compactor and controls an operation of causing a scan path in said logic circuit to shift upon receiving the pattern;

a device circuit which operates upon receiving the clock; and a device circuit built-in self test circuit which executes a built-in self test of said device circuit, wherein while said device circuit built-in self test circuit is executing the built-in self test of said device circuit, said logic built-in self test circuit is set in a low power consumption mode, said pattern generator maintains a data holding state immediately before said logic built-in self test circuit is set in the low power consumption mode, generates a fixed value in place of the pattern, and inputs the fixed value to said logic circuit, and said pattern compactor maintains a data holding state immediately before said logic built-in self test circuit is set in the low power consumption mode and stops a compaction operation.

According to one aspect of the invention, there are provided a semiconductor integrated circuit design apparatus comprising:

a memory built-in self test circuit generation device which generates circuit information of a built-in self test circuit of a memory included in a semiconductor integrated circuit on the basis of configuration information of the memory;

a logic built-in self test circuit generation device which generates circuit information of a built-in self test circuit of a logic circuit included in the semiconductor integrated circuit on the basis of information of the logic circuit;

a test sequence control circuit generation device which generates circuit information of a test sequence control circuit that controls a test sequence so as to satisfy a power consumption condition, on the basis of the circuit information of the memory built-in self test circuit, the circuit information of the logic circuit built-in self test circuit, a test condition of the semiconductor integrated circuit, and the power consumption condition in a test; and a test circuit insertion device which receives the circuit information of the semiconductor integrated circuit and adds the circuit information of the memory built-in self test circuit, the circuit information of the logic circuit built-in self test circuit, and the circuit information of the test sequence control circuit to the circuit information of the semiconductor integrated circuit, thereby outputting circuit information of the semiconductor integrated circuit in which the memory built-in self test circuit, the logic circuit built-in self test circuit, and the test sequence control circuit are inserted.

DETAILED DESCRIPTION OF THE PREFERRED EMBODIMENTS

The embodiments of the present invention will be described below with reference to the accompanying drawings.

(1) First Embodiment

Figure 1:
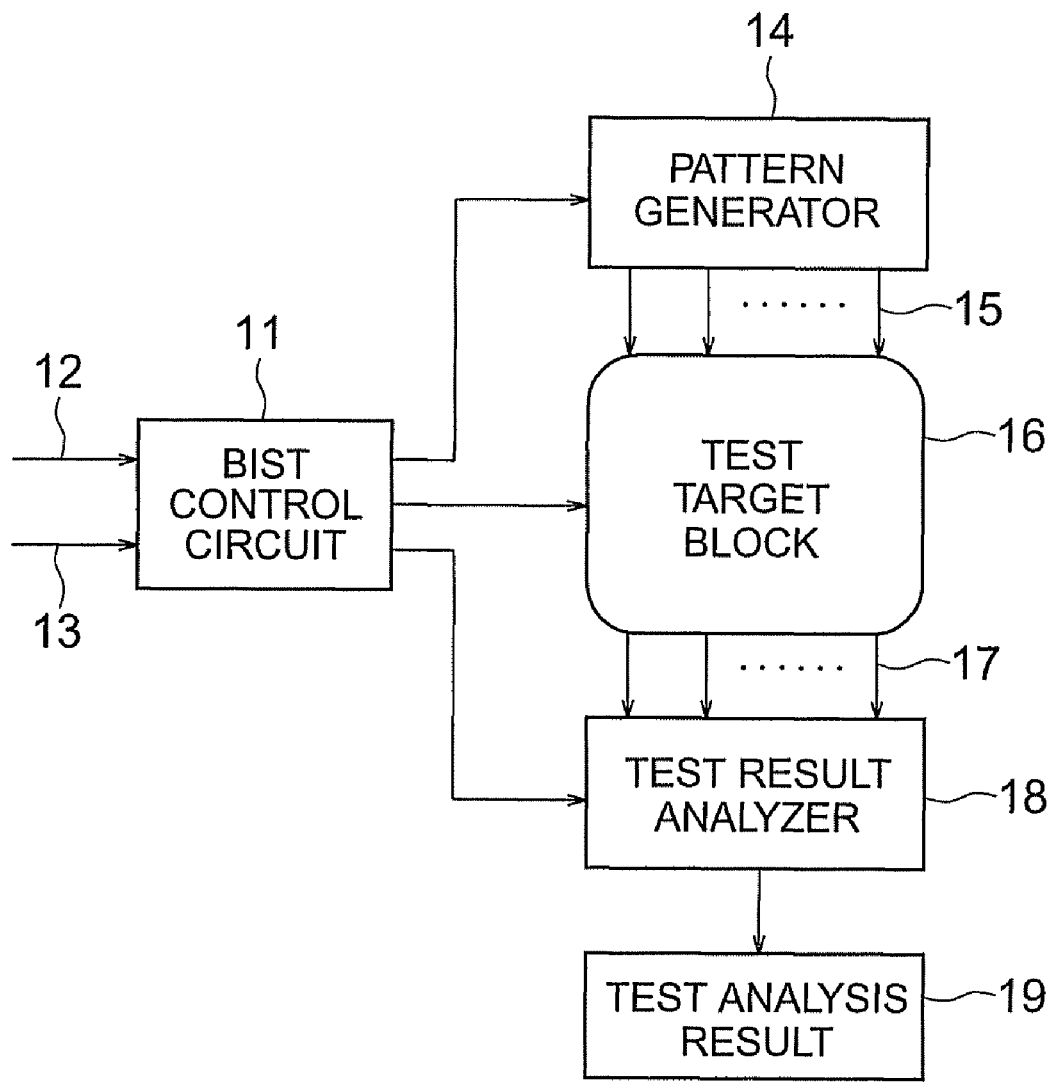
FIG. 1 is a block diagram showing the schematic arrangement of a test system in executing a BIST of a semiconductor integrated circuit according to the first embodiment of the present invention.

FIG. 1 shows the schematic arrangement of a test executed for a test target block by a BIST control circuit.

An external input signal 12 to set a test mode is input to a BIST control circuit 11, thereby setting a test target block 16 in the test mode. In this mode, the input terminals of the test target block 16 receive a test signal which is different from that in the normal operation, and the output terminals feed data also to the BIST logic.

The BIST control circuit 11 is initialized. Then, a predetermined number of BIST clocks 13 are input to execute the BIST. During the BIST, a test pattern 15 generated by a pattern generator 14 is automatically input to the test target block 16.

A test result 17 output from the test target block 16 is input to a test result analyzer 18. The test result 17 is compared with an expected value one by one, or compacted and converted into data (signature) with a predetermined bit length. The test result analyzer 18 finally outputs a test analysis result 19 of the test target block 16.

Figure 2:
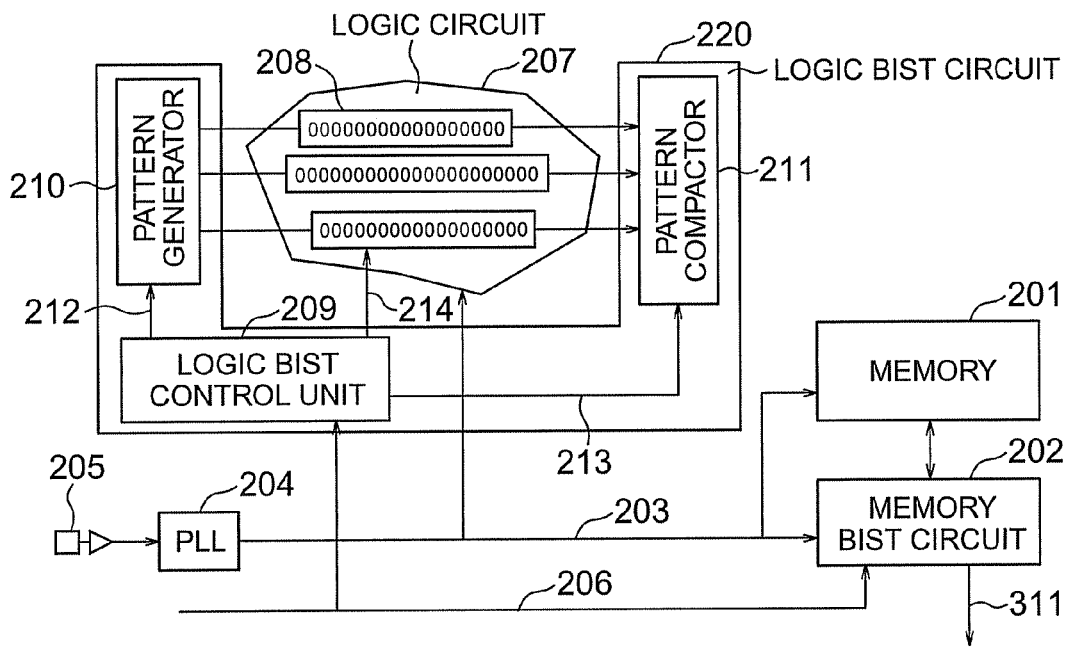
FIG. 2 is a block diagram showing the arrangement of the semiconductor integrated circuit according to the first embodiment of the present invention.

FIG. 2 shows the circuit arrangement to execute the BIST of memory and logic circuits as a test target block in the semiconductor integrated circuit according to the first embodiment.

This semiconductor integrated circuit comprises, in addition to a memory 201 serving as a test target block, a memory BIST circuit 202, a phase locked loop (to be referred to as a PLL hereinafter) circuit 204, an external clock input terminal 205, a logic circuit 207 corresponding to a test target block and having a plurality of scan paths 208, and a logic BIST circuit 220 having a logic BIST control unit 209, pattern generator 210, and pattern compactor 211.

The memory BIST circuit 202 executes a BIST of the memory 201 and operates at the same high-speed clock 203 as the memory 201. A BIST enable signal 206 sets the memory BIST circuit 202 in a BIST operation start state.

The high-speed clock 203 is generated by inputting a clock from the external clock input terminal 205 to the PLL circuit 204 serving as an on-chip clock signal generation circuit.

Figure 3:
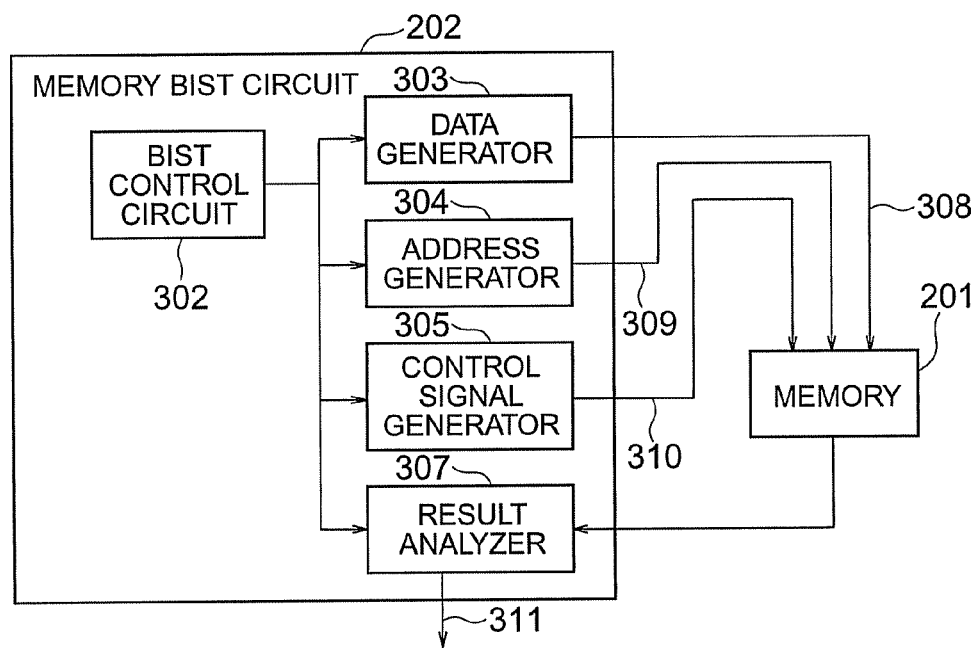
FIG. 3 is a block diagram showing the arrangement of a memory BIST circuit arranged in the semiconductor integrated circuit according to the first embodiment.

FIG. 3 shows the arrangement of the memory BIST circuit 202.

A BIST control circuit 302 in the memory BIST circuit 202 controls a data generator 303, address generator 304, and control signal generator 305 to sequentially automatically generate a data input signal 308, address input signal 309, and control signal 310. These signals are supplied to the memory 201 to make it execute read/write operation.

Data output from the memory 201 as a result of read is input to a result analyzer 307. The result analyzer 307 executes analysis to check whether it is a correct output and outputs an analysis result signal 311.

The analysis technique includes a comparison scheme of sequentially comparing readout data with an expected value generated in the memory BIST circuit 202, and a compaction scheme of sequentially compacting data and comparing the final compaction result with an expected value generated in advance.

The serial logic BIST circuit 220 in FIG. 2 executes the BIST of the logic circuit 207.

The logic BIST circuit 220 has the logic BIST control unit 209, pattern generator 210, and pattern compactor 211.

The logic BIST control unit 209 controls the operation of the entire logic BIST circuit. The BIST enable signal 206 sets the logic BIST circuit in a BIST operation start state.

The pattern generator 210 generates a pattern upon receiving a pattern generator control signal 212 from the logic BIST control unit 209. The pattern compactor 211 compacts a pattern upon receiving a pattern compactor control signal 213 from the logic BIST control unit 209.

The high-speed clock 203 generated by the PLL circuit 204 is also input to the logic circuit 207. Since no switching circuit to switch clock input is inserted in the clock path that inputs the high-speed clock 203 to the logic circuit 207, there is no influence on clock timing adjustment.

As shown in FIG. 2, all or some of the internal registers of the logic circuit 207 are replaced with scan registers having a serial shift function to form the plurality of scan paths 208.

The input side of each scan path 208 connects to the pattern generator 210 in the logic BIST circuit 220 while the output side connects to the pattern compactor 211.

One test operation in the logic BIST circuit 220 includes a combination of a shift mode to shift-input a pattern generated by the pattern generator 210 to the scan registers in the logic circuit 207 and set a value, a capture mode to propagate the set pattern to logic parts except the scan registers, which are connected to the scan registers, and make the scan registers to receive the propagation result, and a shift mode to sequentially shift-output the propagation result received by the scan registers. The shift mode to do shift output in the first test operation and the shift mode to do shift input in the second test operation are executed in parallel at the same timing.

The pattern generator 210 in the logic BIST circuit 220 often uses linear feedback shift registers (to be referred to as LFSRs hereinafter) because of their simple structure.

On the other hand, the pattern compactor 211 applicable to both the memory BIST circuit 202 and the logic BIST circuit 220 generally uses multiple input signature registers (to be referred to as MISRs hereinafter) as a modification of the LFSR.

The arrangement of the MISR is basically the same as the LFSR except that input data are received in parallel.

The arrangements and properties of the normally used LFSR and MISR are explained in detail in the following reference.

[Non-patent Reference 1] Built-in Test for VLSI: Pseudo Random Techniques, Paul H. Bardell, William H. McAnney and Jacob Savir, John Wiley & Sons, 1987.

Figure 4:
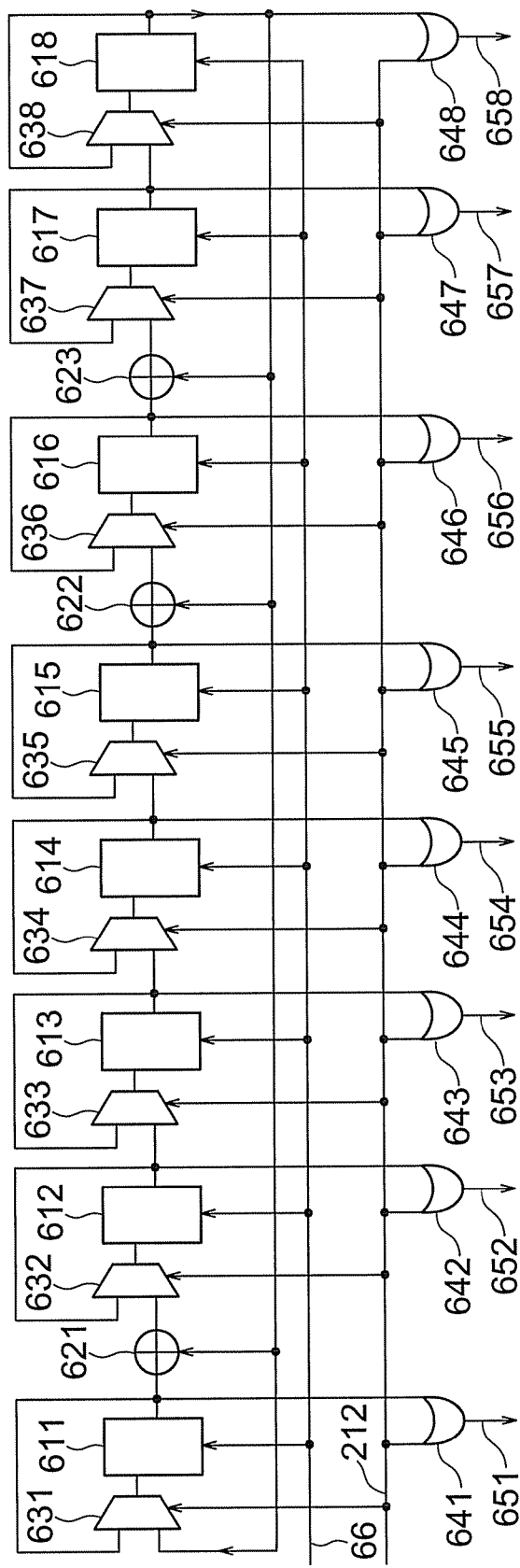
FIG. 4 is a circuit diagram showing the arrangement of an 8-bit LFSR circuit of the memory BIST circuit arranged in the semiconductor integrated circuit according to the first embodiment.

FIG. 4 shows the arrangement of an 8-bit LFSR used in the pattern generator 210 of the logic BIST circuit 220 according to the first embodiment of the present invention.

This LFSR comprises registers 611 to 618, exclusive OR (to be referred to as EXOR hereinafter) elements 621 to 623, multiplexers 631 to 638, and OR gates 641 to 648.

The control terminals of the multiplexers 631 to 638 receive the pattern generator control signal 212 shown in FIG. 2.

When the memory BIST is not executed, and the logic BIST is executed not in a low power consumption mode but in the normal mode, the pattern generator control signal 212 of low level is input to the multiplexers 631 to 638. The LFSR performs a normal shift operation in synchronism with a clock 66. That is, the registers 611 to 618 capture data output from the registers 618, and 611 to 617 of the preceding stages via the multiplexers 632 to 638 and sequentially shift the data.

At specific points (feedback points) of connection between the registers 611 to 618, the exclusive OR elements 621, 622, and 623 exclusively OR the outputs from the registers 611, 615, and 616 of the preceding stages and the output from the register 618 of the final stage and output the resultant values to the registers 612, 616, and 617 of the succeeding stages. The feedback points change to unique positions in accordance with the bit width of the LFSR.

The output from the register 618 of the final stage is fed back and input to the register 611 of the first stage. At the remaining points, the output from the register of the preceding stage is directly input to the register of the succeeding stage.

First, the registers 611 to 618 are initialized to appropriate values (not all bits are at low level).

Every time the clock 66 is supplied, the values on the registers 611 to 618 shift to generate random number patterns. The generated patterns are serially output from the register 618 of the final stage, or output from the OR elements 641 to 648 as parallel outputs 651 to 658 from the registers 611 to 618 and supplied to the scan path 208.

As a characteristic feature of the LFSR, when a certain combination of feedback points is employed, a combination of N-bit patterns except a pattern with all bits at low level is generated at a predetermined period. The feedback point combination at this time is called a primary combination. This is an advantage of a pseudo random number pattern generator. This is the reason why an LFSR is often used.

When a memory BIST is being executed in the low power consumption mode, the pattern output circuit control signal 212 changes to high level. When this signal 212 is input to the multiplexers 631 to 638, the outputs from the registers 611 to 618 are fed back to their inputs so that the registers hold the current values. Hence, the LFSR maintains the data held immediately before the low power consumption mode is set.

At the same time, a signal 212 of high level is input to the OR elements 641 to 648 inserted in the parallel output units. The outputs 651 to 658 in the BIST mode are fixed at high level. These fixed values are supplied as a shift input to the scan path 208.

Figure 5:
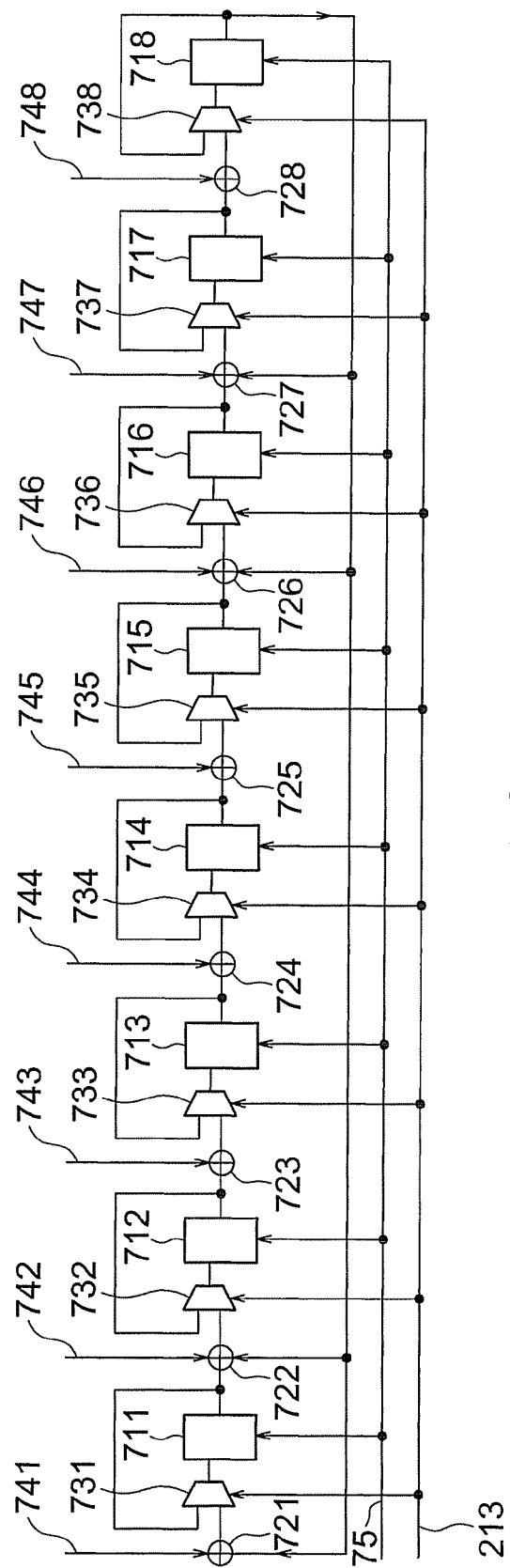
FIG. 5 is a circuit diagram showing the arrangement of an 8-bit MISR circuit of the memory BIST circuit arranged in the semiconductor integrated circuit according to the first embodiment.

FIG. 5 shows the arrangement of an 8-bit MISR used in the pattern compactor 211 of the logic BIST circuit 220 according to the first embodiment.

The MISR has registers 711 to 718, EXOR elements 721 to 728, and multiplexers 731 to 738.

The control terminals of the multiplexers 731 to 738 receive the pattern compactor control signal 213 shown in FIG. 2.

When the memory BIST is not executed, and the logic BIST is executed not in a low power consumption mode but in the normal mode, the pattern compactor control signal 213 of low level is input to the multiplexers 731 to 738. The MISR performs a normal compaction operation in synchronism with a clock 75. That is, the registers 611 to 618 hold data output from the registers 718, and 711 to 717 of the preceding stages via the multiplexers 732 to 738 and shift the data.

At specific points (feedback points) of connection between the registers 711 to 718, i.e., at the outputs of the registers 711, 715, 716, and 718, the EXOR elements 722, 726, 727, and 721 add parallel data inputs 742, 746, 747, and 741, the outputs from the registers 711, 715, 716, and 718 of the preceding stages, and the output from the register 718 of the final stage. At the outputs of the remaining registers 712, 713, 714, and 717, the EXOR elements 723, 724, 725, and 728 add parallel data inputs 743, 744, 745, and 748 and the outputs from the registers 712, 713, 714, and 717 of the preceding stages.

The compaction operation is executed by initializing the registers 711 to 718 to appropriate values (normally, all bits are at low level "0") and compacting them while sequentially receiving the parallel data inputs by the clock 75.

A bit string that finally remains on the registers 711 to 718 at the end of all data input is the compaction result. The compaction result is compared with an expected value, thereby determining whether test target block is defective or not. The bit string is called a signature. The process of analyzing the compaction result is called signature analysis.

A single fault in the test target block is overlooked in the N-bit MISR due to missing information (alias) upon compaction at a probability of $1/2^N$. If N is as large as 16 or 32, the probability can be neglected. As described above, the MISR is suitable as a compactor due to the above reasons and its simple arrangement.

The MISR according to the first embodiment has the multiplexers 731 to 738 to switch between the paths that supply the outputs from the EXOR elements 741 to 748 of the preceding stages to the registers 711 to 718 as usual and the paths that feed back the outputs from the registers 711 to 718 to their inputs.

The selection input terminals of the multiplexers 731 to 738 receive the pattern compactor control signal 213, as described above.

When the memory BIST starts in the low power consumption mode, the pattern compactor control signal 213 changes to high level. The outputs from the registers 711 to 718 are fed back to their inputs so that the registers hold the current values. Hence, the LFSR maintains the data holding state immediately before the low power consumption mode is set.

When the LFSR and MISR shown in FIGS. 4 and 5 are used as the pattern generator 210 and pattern compactor 211, respectively, the low power consumption mode of the logic BIST can be implemented.

In the first embodiment, as shown in FIG. 2, the BIST enable signal 206 to start the BIST of the memory 201 is input to the memory BIST circuit 202 and also to the logic BIST control unit 209 of the logic BIST circuit 220.

Hence, in the first embodiment, at the start of memory BIST, the logic BIST circuit 220 receives the BIST enable signal 206 and sets the logic circuit 207 in the low power consumption mode.

In the low power consumption mode, the test operation of the logic circuit 207 stops. The logic circuit 207 is fixed in the shift mode by a shift enable signal 214 supplied from the logic BIST control unit 209 to the scan path 208.

In the low power consumption mode, the pattern generator 210 continuously inputs a fixed value of low level "0" or high level "1" to the scan path 208 on the basis of the pattern generator control signal 212, instead of generating a random test pattern, as described above with reference to FIG. 4.

The input to the combinational circuit part of the logic circuit 207 is fixed so no signal transition occurs. As a result, the ON/OFF operation of each transistor switch in the logic circuit 207 is minimized so that power consumption is reduced to minimum.

In the low power consumption mode, the pattern compactor 211 maintains, on the basis of the pattern compactor control signal 213, the data holding state immediately before the low power consumption mode is set, instead of receiving the shift output from the scan path 208, as described above with reference to FIG. 5.

As described above, according to the first embodiment, the high-speed clock 203 is supplied not only to the memory BIST circuit 202 but also to the logic circuit 207. The pattern generator 210 of the logic BIST circuit 220 supplies the fixed value of low level "0" or high level "1" to the scan path 208, as described above with reference to FIG. 4. It is therefore possible to reduce the power consumption of the logic circuit 207 during the memory BIST.

(2) Second Embodiment

A semiconductor integrated circuit according to the second embodiment of the present invention will be described.

In the first embodiment, the logic BIST circuit 220 is set in the low power consumption mode when the BIST of the memory 201 starts, as described above. This arrangement can reduce the power consumption of the logic circuit 207 during the BIST of the memory 201.

The second embodiment provides an arrangement that allows to interrupt or resume the test of a logic circuit 207 if the BIST of a memory 201 starts during the BIST of the logic circuit 207, in addition to the arrangement of the first embodiment.

Figure 6:
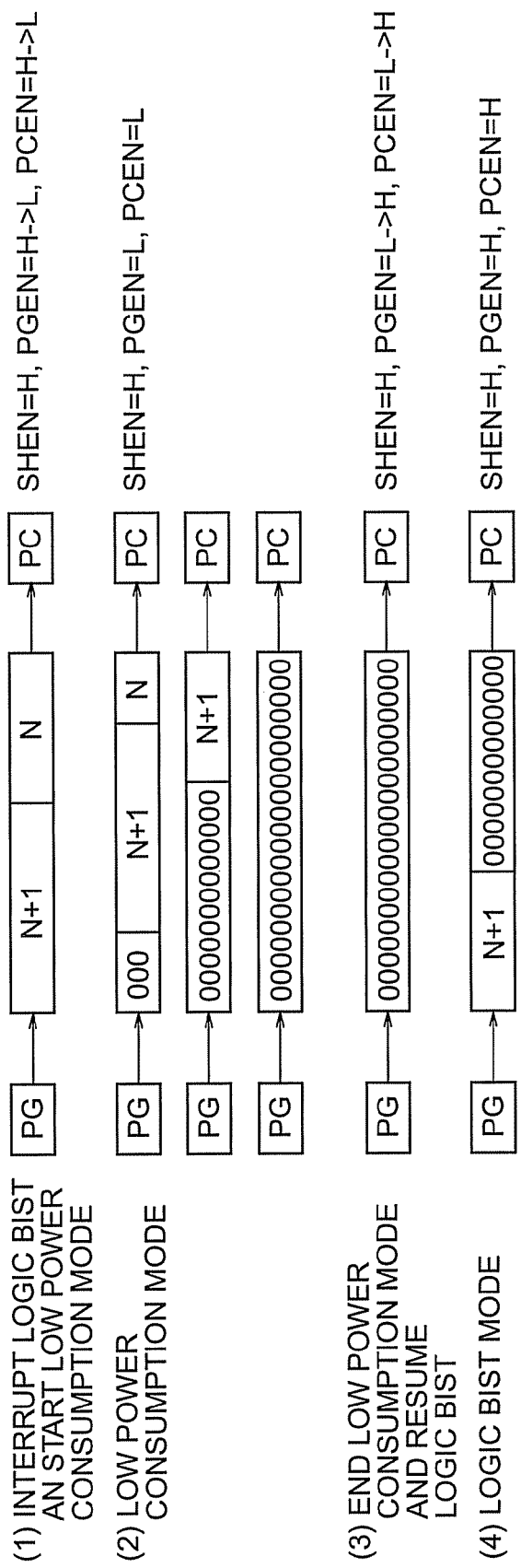
FIG. 6 is an explanatory view showing an operation in a low power consumption mode of a logic BIST circuit arranged in the semiconductor integrated circuit according to the first embodiment.

FIG. 6 shows an operation procedure of starting and ending the low power consumption mode during the BIST of a logic circuit in a semiconductor integrated circuit according to a reference example that has no arrangement of the second embodiment.

At (1) of FIG. 6, a low power consumption mode signal to start the low power consumption mode is supplied to interrupt the BIST of the logic circuit. The pattern generator (PG) and pattern compactor (PC) shift to the low power consumption mode.

When a shift enable signal SHEN changes to high level "H", a shift state is set. An enable signal PGEN of the pattern generator (PG) changes from high level (operative state) "H" to low level (stop state) "L" to stop the operation. An enable signal PCEN of the pattern compactor (PC) changes from high level "H" to low level "L" to stop the operation.

"N" in FIG. 6 indicates that the Nth test result is being shifted in the scan path. The next "N+1" indicates that the (N+1)th test input or test result is being shifted.

As indicated by (2) in FIG. 6, the low power consumption mode is set. The pattern generator starts outputting a fixed value ("0" in this case), and pattern compactor steps the compaction operation.

At this point of time, the test result of the Nth pattern is shift-output on the scan path. Next, the test input of the (N+1)th pattern is being shifted. Since the test is interrupted during the shift, the pattern is input to the scan path only halfway. Hence, the (N+1)th pattern is tested in a state different from that without test interrupt because all bits are replaced with the fixed value "0" before the whole pattern is input.

The finally observed test compaction result of the (N+1)th pattern is different from that observed when no interrupt occurs and cannot be compared with the actual expected value.

At (3) in FIG. 6, the low power consumption mode finishes, and the BIST of the logic circuit is resumed. The enable signal PGEN of the pattern generator (PG) changes from low level "L" to high level "H" to start the pattern compactor operation. The enable signal PCEN of the pattern compressor (PC) changes from low level "L" to high level "H" to start the pattern compaction operation.

At (4) in FIG. 6, the remaining part of the (N+1)th pattern that was interrupted is input to the scan path. That is, since the (N+1)th pattern is input from halfway instead of re-inputting it from the beginning, the test cannot be resumed.

Figure 7:
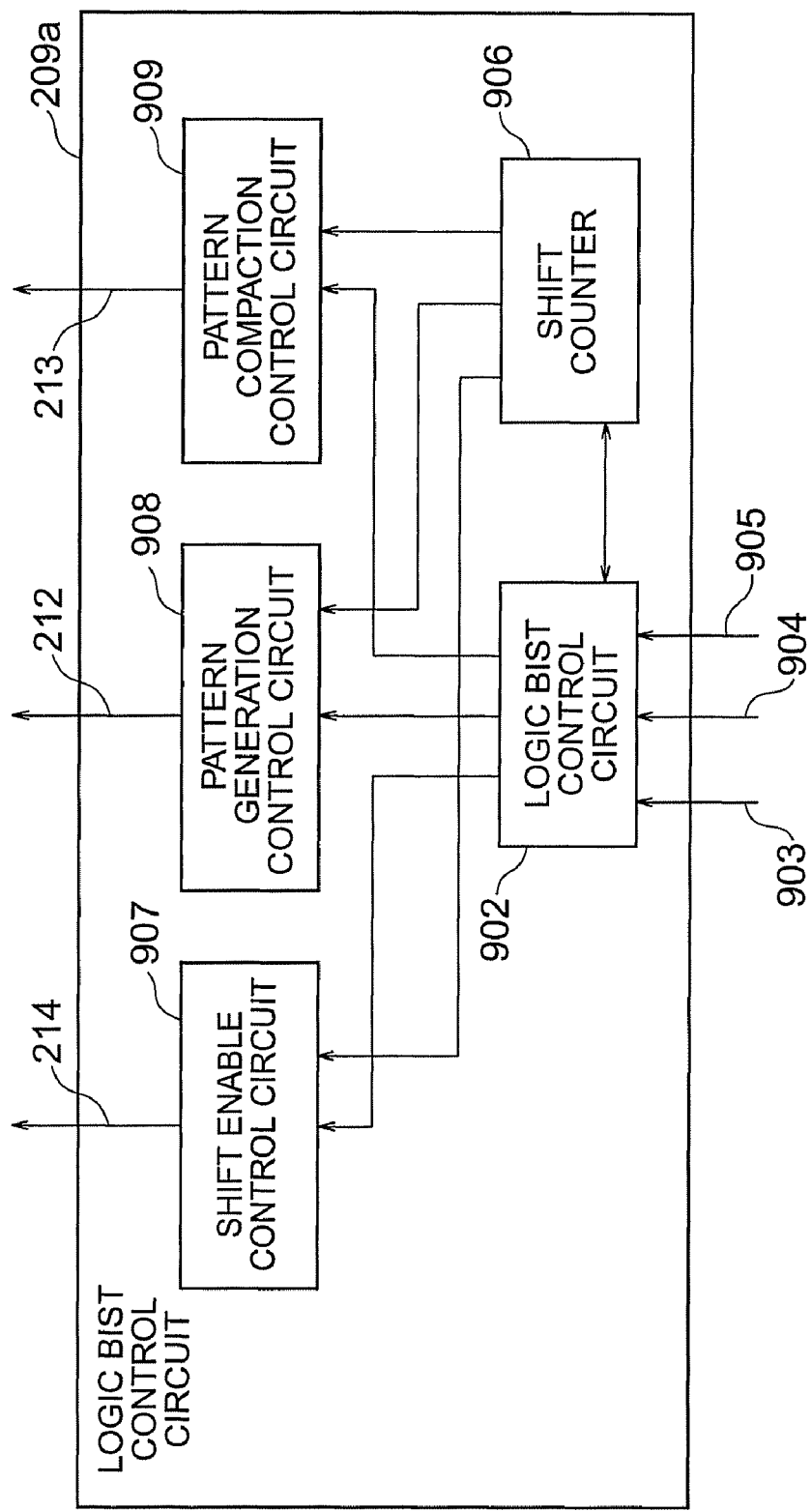
FIG. 7 is a block diagram showing the arrangement of a logic BIST circuit arranged in a semiconductor integrated circuit according to the second embodiment of the present invention.

In the second embodiment, to allow interrupt and resumption of the test, a logic BIST control circuit 209*a* in FIG. 2 has the arrangement shown in FIG. 7.

The logic BIST control circuit 209a comprises a logic BIST control circuit 902, shift counter 906, shift enable control circuit 907, pattern generation control circuit 908, and pattern compaction control circuit 909.

The logic BIST control circuit 902 receives a BIST start signal 903, BIST low power consumption mode signal 904, and BIST end signal 905 from an external device and controls the operations of the shift counter 906, shift enable control circuit 907, pattern generation control circuit 908, and pattern compaction control circuit 909.

The shift counter 906 counts the current shift stage of the scan path in the logic circuit.

The logic BIST control circuit 902 outputs a shift enable signal 214 via the shift enable control circuit 907 to control the shift operation until the shift operation of the current pattern and the next ((N+1)th)) pattern from the current (Nth) shift stage finishes.

The logic BIST control circuit 902 also notifies the pattern generation control circuit 908 that the mode changes to the low power consumption mode when shift input of the next ((N+1)th) pattern is ended.

Upon receiving this notification, the pattern compaction control circuit 908 outputs a pattern compactor control signal 212 to notify a pattern compactor 210 when shift input of the next ((N+1)th) pattern is ended on the basis of the count value of the shift counter 906.

The logic BIST control circuit 902 also notifies the pattern compaction control circuit 909 that the mode changes to the low power consumption mode when shift output of the next ((N+1)th) test result is ended.

Upon receiving this notification, the pattern compaction control circuit 909 outputs a pattern compactor control signal 213 to notify a pattern compactor 211 when the system clock is input at the end of shift of the next ((N+1)th) pattern, the next test result is received, and shift output of the test result is ended.

Figure 8:
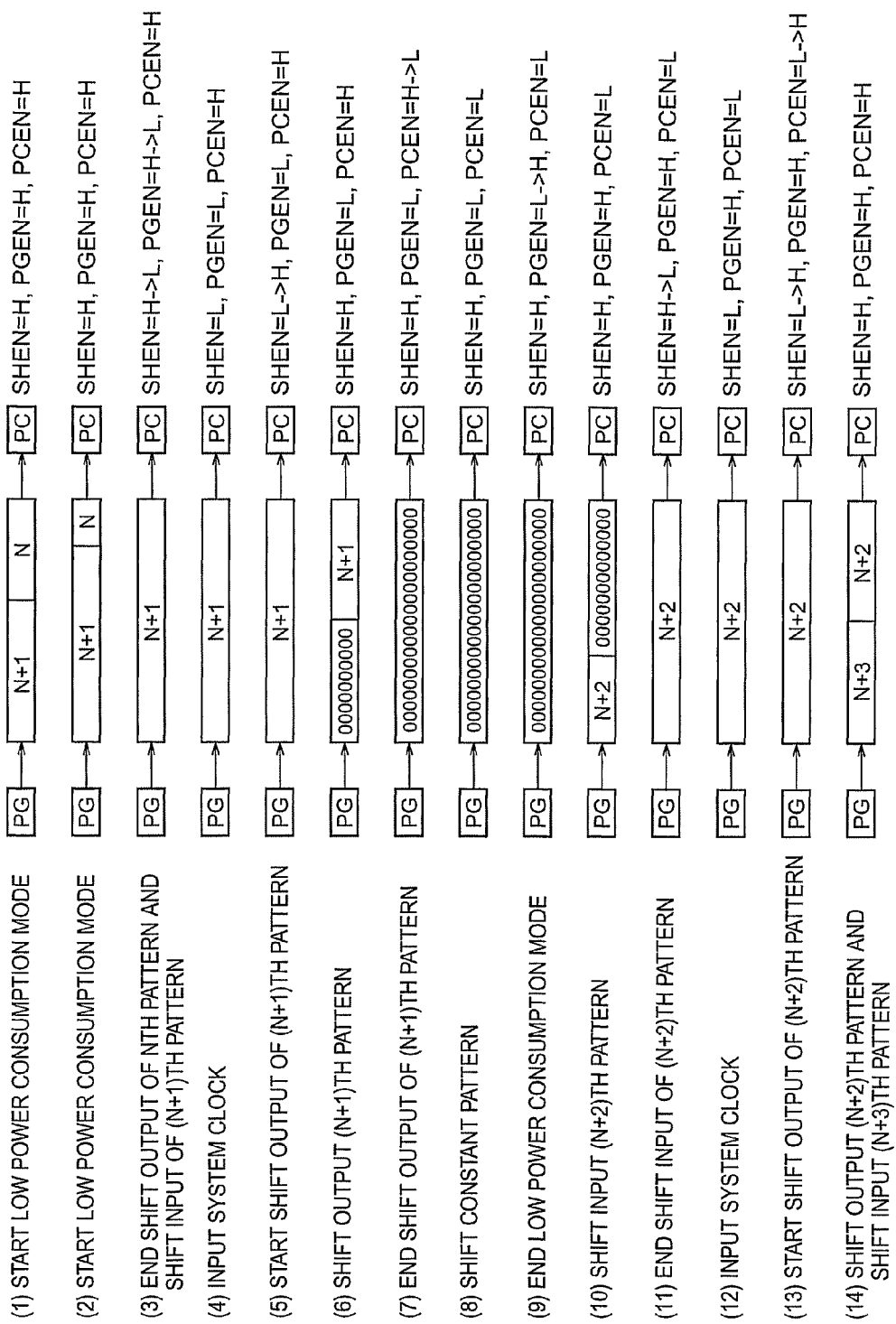
FIG. 8 is an explanatory view showing an operation in a low power consumption mode of the logic BIST circuit arranged in the semiconductor integrated circuit according to the second embodiment.

FIG. 8 shows an operation procedure of setting the low power consumption mode to execute a memory BIST during the BIST of the logic circuit 207 and then ending the mode in the second embodiment.

At (1) and (2) in FIG. 8, when the logic BIST control circuit 209a receives the low power consumption mode signal 904, shift output of the test result of the current Nth pattern and shift input of the next (N+1)th pattern are continued without interrupting the operation of the logic BIST. Unlike the above-described reference example, even when the low power consumption mode signal 904 is received, the logic BIST operation continues until shift output of the test result of the current Nth pattern and shift input of the next (N+1)th pattern which has already started the shift input are ended. During this time, the enable signal PGEN of the pattern generator 210 is at high level "H" so that the pattern generator is in the operative state. The enable signal PCEN of the pattern compactor 211 is at high level "H" so that the pattern compactor is in the operative state.

At (3) in FIG. 8, Nth pattern shift output and (N+1)th pattern shift input are ended. The shift enable signal SHEN changes to low level "L", and the enable signal PGEN of the pattern generator 210 changes to low level.

At (4) in FIG. 8, the scan shift mode changes to a capture mode to input the system clock.

The scan register receives the test result of the (N+1)th pattern.

Input of the next pattern is interrupted. At this point of time, the level of the pattern generator control signal 212 to the pattern generator 210 is changed to set the low power consumption mode.

At (5) in FIG. 8, shift output of the test result of the (N+1)th pattern starts. The test result is input to the pattern compactor 211 and compacted. The shift enable signal SHEN changes to high level "H".

As the shift output progresses, e.g., a fixed value "0" is continuously shift-input at (6) in FIG. 8 because the pattern generator 210 is set in the low power consumption mode.

At (7) in FIG. 8, shift output of the test result of the (N+1)th pattern is ended. All bits of the registers on the scan path have a value "0".

At this point of time, the level of the pattern compactor control signal 213 to the pattern compactor 211 is changed to set the low power consumption mode. The shift enable signal SHEN changes to low level "L".

At (8) in FIG. 8, the pattern generator 210 continuously inputs the same fixed value "0" while holding the register values. The pattern compactor 211 continuously holds the register values immediately before the low power consumption mode is set without receiving the shift output.

At (9) in FIG. 8, the logic BIST control circuit 902 receives the signal 904 which notifies that the low power consumption mode is ended, and the pattern generator 210 ends the low power consumption mode.

The enable signal PGEN of the pattern generator 210 changes to high level "H". The pattern generator 210 in the holding state starts shift-inputting the next (N+2)th test pattern to the scan path 208 at (10) in FIG. 8. The pattern compactor 211 does not receive the fixed value "0" that exists before the (N+2)th test pattern.

At this time, the pattern compactor 211 is still in the low power consumption mode, and the enable signal PCEN maintains low level "L".

At (11) in FIG. 8, shift input of the (N+2)th pattern is ended. The scan path changes from the scan shift mode to the capture mode. The shift enable signal SHEN changes to low level "L".

At (12) in FIG. 8, the system clock is input to cause the scan register to receive the test result of the (N+2)th pattern.

At (13) in FIG. 8, shift output of the test result of the (N+2)th pattern starts. At this time, the pattern compactor 211 ends the low power consumption mode and resumes pattern compaction from the holding state. The enable signal PCEN of the pattern compactor 211 changes to high level.

From then on, at (14) in FIG. 8, shift output of the (N+2)th pattern and shift input of the (N+3)th pattern are executed as the normal logic BIST operation, as before the interrupt.

As described above, according to the second embodiment, the logic BIST circuit 220 shifts to the low power consumption mode if the test of another circuit, e.g., the memory BIST starts during the logic BIST. The power consumption of the logic circuit 207 is minimized by continuously shift-inputting a fixed value. When the other test is ended, the logic BIST operation is resumed from the state upon interrupt. It is therefore possible to obtain the same test result as in a case without interrupt.

Since the test can be interrupted, the degree of freedom in test scheduling rises, and the total test efficiency can be increased.

Since no new circuits are added on the system path in the second embodiment, the system performance is not affected.

(3) Third Embodiment

A semiconductor integrated circuit according to the third embodiment of the present invention will be described.

The second embodiment is applicable when at least one logic BIST circuit exists, and the number of memory BIST circuits provided as BIST circuits other than the logic BIST circuit is not limited.

To the contrary, the third embodiment is applicable when two or more logic BIST circuits exist, and the number of BIST circuits other than the logic BIST circuits is not limited.

Figure 9:
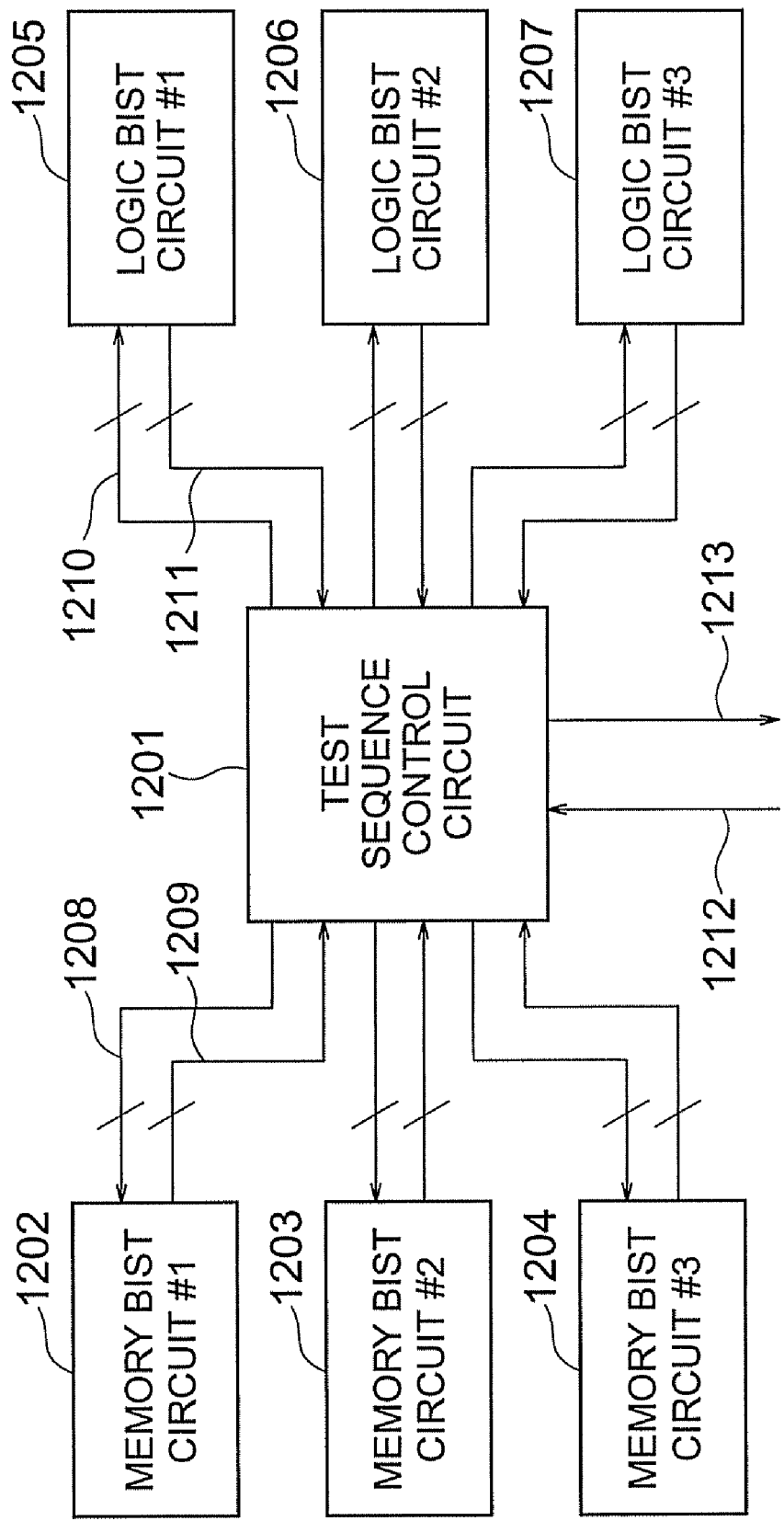
FIG. 9 is a block diagram showing the arrangement of a memory BIST circuit arranged in a semiconductor integrated circuit according to the third embodiment of the present invention.

As shown in FIG. 9, the third embodiment comprises a test sequence control circuit 1201 which controls the sequence of executing a BIST of a plurality of test target blocks, and a memory BIST circuit #1 1202, memory BIST circuit #2 1203, memory BIST circuit #3 1204, logic BIST circuit #1 1205, logic BIST circuit #2 1206, and logic BIST circuit #3 1207 which execute a BIST of the test target blocks (memory circuits #1 to #3 and logic circuits #1 to #3).

The test sequence control circuit 1201 controls the operations of the three memory BIST circuits #1 1202 to #3 1204 and the three logic BIST circuits #1 1205 to #3 1207.

Each of the memory BIST circuits #1 1202 to #3 1204 executes the BIST of a test target, i.e., a memory divided into banks or blocks. The test target may be different areas in one or two memories. Alternatively, one memory BIST circuit may execute the BIST of a plurality of memories as a test target.

Similarly, each of the logic BIST circuits #1 1205 to #3 1207 executes the BIST of a test target, i.e., a logic circuit divided into blocks. The test target may be different areas in one or two logic circuits.

The logic BIST circuits #1 1205 to #3 1207 have the arrangement for interrupting and resuming the BIST and the arrangement for reducing power consumption described in the second embodiment.

The test sequence control circuit 1201 receives an external test start signal 1212 to start the test and outputs a test end signal 1213 upon ending the test.

The test sequence control circuit 1201 inputs a BIST enable signal and BIST start signal 1208 to the memory BIST circuits #1 1202 to #3 1204 to start the BIST.

When the BIST starts, the memory BIST circuits #1 1202 to #3 1204 outputs a holding start signal, holding end signal, and BIST end signal 1209 to the test sequence control circuit 1201.

Similarly, the test sequence control circuit 1201 inputs a BIST enable signal, BIST start signal, holding start signal, holding end signal, and BIST end signal 1210 to the logic BIST circuits #1 1205 to #3 1207. The logic BIST circuits #1 1205 to #3 1207 output a BIST end signal 1211 to the test sequence control circuit 1201. Although not illustrated in FIG. 9, a clock is supplied to the test sequence control circuit 1201 memory BIST circuits #1 1202 to #3 1204, and logic BIST circuits #1 1205 to #3 1207 to operate them.

Figure 10:
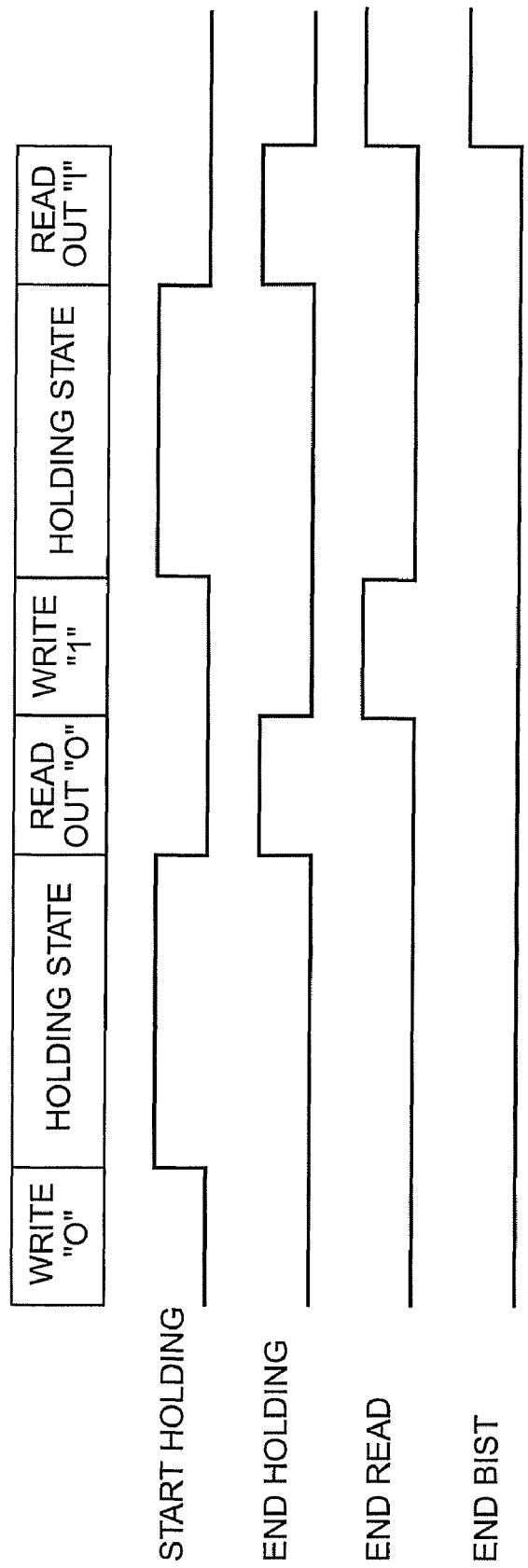
FIG. 10 is an explanatory view showing the contents of a memory BIST in the semiconductor integrated circuit according to the third embodiment.

FIG. 10 shows the operation procedure and contents of a memory BIST executed in the third embodiment.

In this test, the holding properties of a memory 201 are tested by using background data with all "0" bits or all "1" bits.

First, the memory BIST circuit writes a pattern with all "0" bits in the memory 201 and shifts to the holding state.

During the holding state, the BIST circuit does not access the memory 201.

When a predetermined period elapses, the holding state finishes, and a read operation of the write data "0" starts. The length of the predetermined period may be measured by a counter mounted on the semiconductor integrated circuit or decided by inputting a signal from the circuit. This operation is also executed for background data with all "1" bits.

When the holding operation starts, the memory BIST circuit changes the holding start signal to high level. When the holding operation finishes, the holding end signal changes to high level.

At the end of read operation, the read end signal changes to high level.

The holding start signal, holding end signal, and read end signal return to low level when the holding operation, read operation, and next write operation are executed, or the BIST operation finishes.

At the end of BIST operation, the BIST end signal changes to high level.

Figure 11:
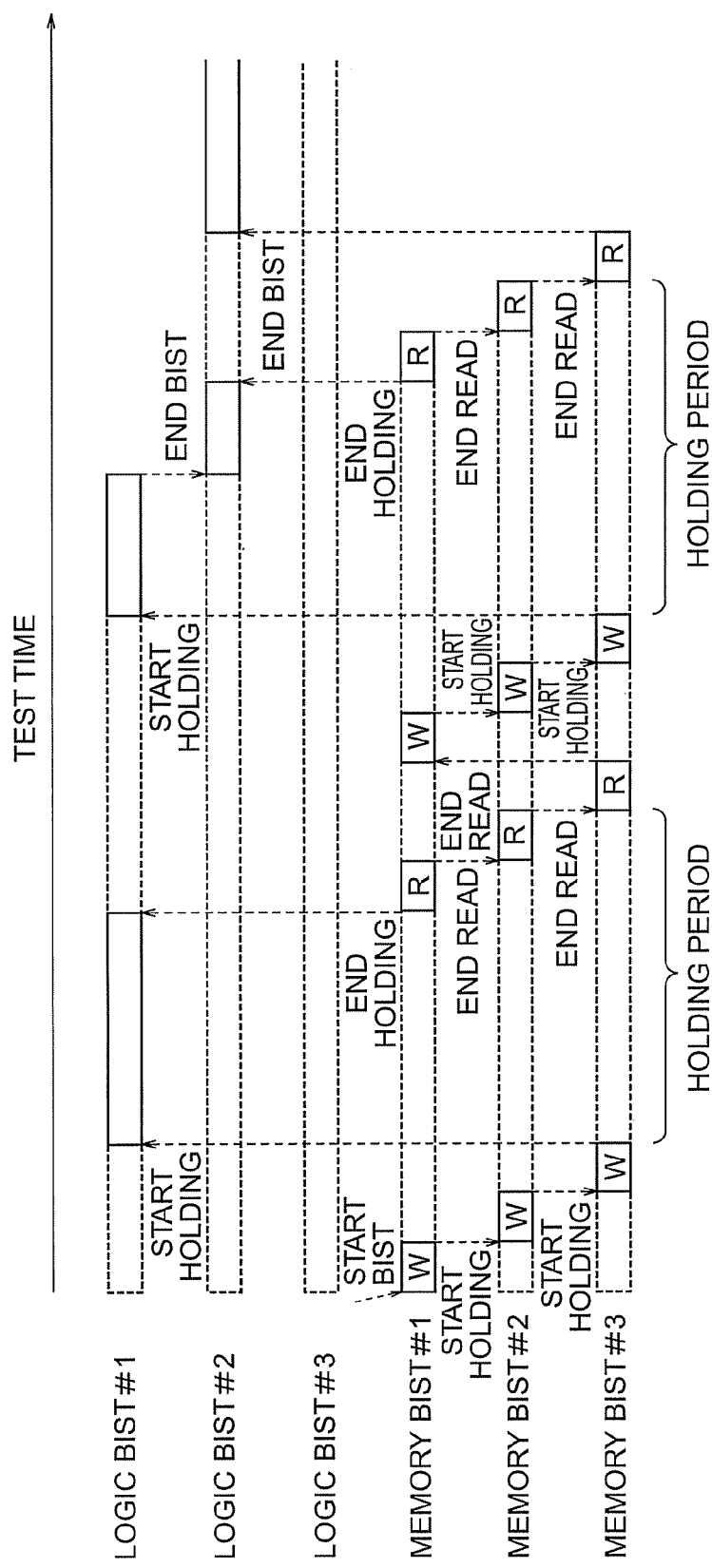
FIG. 11 is an explanatory view showing test sequence scheduling according to the third embodiment.

FIG. 11 shows an example of scheduling of tests executed by the memory BIST circuits #1 1202 to #3 1204 and logic BIST circuits #1 1205 to #3 1207 of the third embodiment.

In this case, assume that the memory BIST circuits #1 1202 to #3 1204 and logic BIST circuits #1 1205 to #3 1207 do not execute the tests in parallel.

During the data holding period of a memory BIST, execution of another BIST is allowed.

At the start and end of BIST operation of each of the memory BIST circuits #1 1202 to #3 1204 and logic BIST circuits #1 1205 to #3 1207, the control signals are transmitted/received via the test sequence control circuit 1201, as described above.

At the start of test, the test sequence control circuit 1201 receives the external test start signal 1212.

The test sequence control circuit 1201 inputs a BIST enable signal to all test circuits. More specifically, the test sequence control circuit 1201 inputs the BIST enable signal 1208 to the memory BIST circuits #1 1202 to #3 1204 and the BIST enable signal 1210 to the logic BIST circuits #1 1205 to #3 1207.

The memory BIST circuits #1 1202 to #3 1204 and logic BIST circuits #1 1205 to #3 1207 are activated and wait for the start of BIST.

During this time, the memory BIST circuits #1 1202 to #3 1204 do not access the memory 201. The logic BIST circuits #1 1205 to #3 1207 are set in the low power consumption mode.

First, the test sequence control circuit 1201 inputs the BIST start signal 1208 to the memory BIST circuit #1 1202. The memory BIST circuit #1 1202 starts writing the first data with all "0" bits and outputs the holding start signal 1209 at the end of operation to be in the holding state.

Upon receiving the holding start signal 1209, the test sequence control circuit 1201 outputs the BIST start signal 1208 to the memory BIST circuit #2 1203. The memory BIST circuit #2 1203 starts a write operation and outputs the holding start signal 1209 at the end of operation to be in the holding state.

Upon receiving the holding start signal 1209, the test sequence control circuit 1201 outputs the BIST start signal 1208 to the memory BIST circuit #3 1204. The memory BIST circuit #3 1204 starts a write operation and outputs the holding start signal 1209 at the end of operation to be in the holding state.

When all the memory BIST circuits #1 1202 to #3 1204 are set in the holding state, the test sequence control circuit 1201 outputs the BIST start signal 1210 to the logic BIST circuit #1 1205. The logic BIST circuit #1 1205 ends the low power consumption mode and starts executing the logic BIST.

If the holding operation period of the memory BIST circuit #1 1202 elapses during the logic BIST, the holding end signal 1209 is output to the test sequence control circuit 1201, and the next read operation starts. At this time, the logic BIST circuit #1 1205 receives the holding end signal 1210 to temporarily interrupt the logic BIST operation and set the low power consumption mode.

The memory BIST circuits #1 1202 to #3 1204 execute the read operation in the same sequence as in the write. When all operations are ended, the memory BIST circuit #1 1202 starts writing data with all "1" bits.

The memory BIST circuits #1 1202 to #3 1204 finish the write operation, as in the write of data with all "0" bits. Then, the memory BIST circuit #3 1204 outputs the holding start signal 1209 to the test sequence control circuit 1201. The test sequence control circuit 1201 outputs the BIST start signal 1210 to the logic BIST circuit #1 1205. The logic BIST circuit #1 1205 ends the low power consumption mode and resumes the logic BIST operation.

When the BIST operation of the logic BIST circuit #1 1205 finishes during the holding period of the memory BIST circuits #1 1202 to #3 1204, the BIST end signal 1211 is output to the test sequence control circuit 1201. The test sequence control circuit 1201 outputs the BIST start signal 1210 to the next logic BIST circuit #2 1206 to start the BIST operation.

When the holding operation period of the memory BIST circuit #1 1202 elapses during the logic BIST operation, the holding end signal 1209 is output to the test sequence control circuit 1201 to start the next read operation.

The Upon receiving the holding end signal 1210 from the test sequence control circuit 1201, the logic BIST circuit #2 1206 interrupts the logic BIST operation and sets the low power consumption mode.

The memory BIST circuits #1 1202 to #3 1204 finish the read operation in the same sequence as in the write. Each of the memory BIST circuits #1 1202 to #3 1204 outputs the BIST end signal 1209.

Upon receiving the BIST end signal 1209 from the memory BIST circuit #3 1204, the test sequence control circuit 1201 resumes the operation of the logic BIST circuit #2 1206.

From then on, the memory BIST circuits #1 1202 to #3 1204 do not operate. Hence, the BIST operation of the logic BIST circuit #3 1207 starts at the end of BIST operation of the logic BIST circuit #2 1206. When the operation of the logic BIST circuit #3 1207 is ended, all tests are ended. The test sequence control circuit 1201 outputs the test end signal 1213 to the outside.

According to the third embodiment, scheduling of the plurality of memory BISTs and logic BISTs is done in accordance with the above-described procedure, thereby optimizing the test time while reducing the power consumption.

In the third embodiment, the commonly provided holding start signal, holding end signal, and BIST end signal 1210 control the start and end of operations of the BIST circuits. This control may be implemented by causing the BIST circuits to directly exchange signals.

(4) Fourth Embodiment

A semiconductor integrated circuit according to the fourth embodiment of the present invention will be described.

Figure 12:
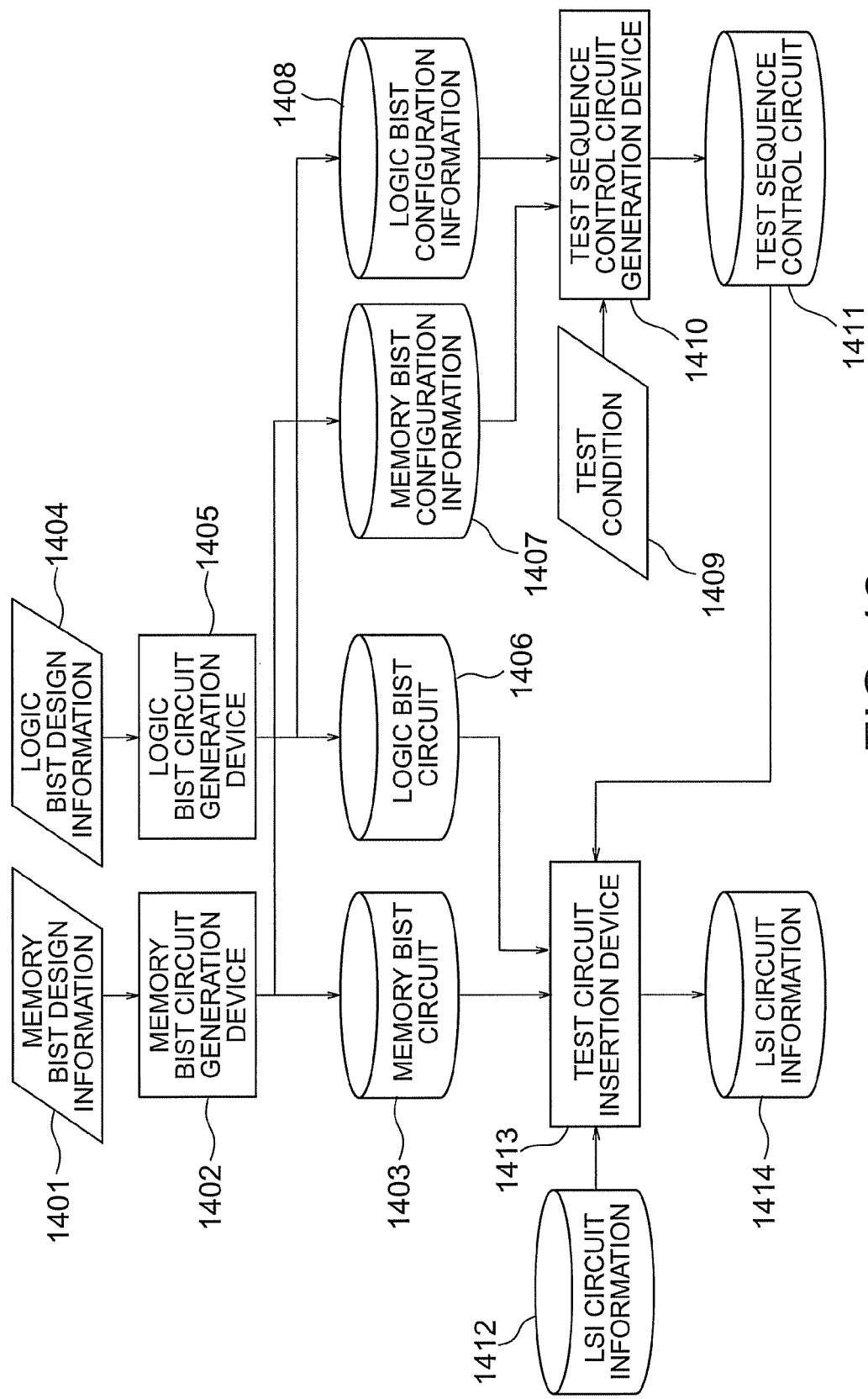
FIG. 12 is a block diagram showing the arrangement of a semiconductor device design apparatus according to the fourth embodiment of the present invention.

FIG. 12 shows the arrangement of a design apparatus according to the fourth embodiment to design the semiconductor integrated circuit of the third embodiment, and input/output information.

The design apparatus according to the fourth embodiment comprises a memory BIST circuit generation device 1402, test circuit insertion device 1413, logic BIST circuit generation device 1405, and test sequence control circuit generation device 1410.

The memory BIST circuit generation device 1402 receives memory BIST design information 1401 and generates a memory BIST circuit 1403 and memory BIST configuration information 1407.

The memory BIST design information 1401 contains information about the configuration of memories to be tested by the memory BIST circuit 1403 and grouping of memories to decide which BIST circuit should execute the test.

The memory BIST configuration information 1407 contains additional information about the module names and pin names in the BIST circuits, and the presence/absence of a holding function, in addition to the memory BIST design information 1401.

The logic BIST circuit generation device 1405 receives logic BIST design information 1404 and generates a logic BIST circuit 1406 and logic BIST configuration information 1408.

The logic BIST design information 1404 contains information about a logic circuit as a BIST target and a clock arrangement.

The logic BIST configuration information 1408 contains additional information about the module names and pin names in the BIST circuits, the number of scan paths, and the length of each scan path, in addition to the logic BIST design information 1404.

The test sequence control circuit generation device 1410 receives a test condition 1409 in addition to the memory BIST configuration information 1407 and logic BIST configuration information 1408 and generates test sequence control circuit 1411.

The test condition 1409 contains information about the test clock frequency of each block as a test target block, the upper limits of peak and average power consumption during the test, and the memory BIST holding period.

Upon receiving the memory BIST configuration information 1407, logic BIST configuration information 1408, and test condition 1409, the test sequence control circuit generation device 1410 calculates the power consumption in test and the test time of each memory or logic unit and generates the test sequence control circuit 1411 capable of preventing the power consumption in test from exceeding the limit and minimizing the total test time by executing another test during the holding period of memory BIST.

The test circuit insertion device 1413 receives the generated memory BIST circuit 1403, logic BIST circuit 1406, and test sequence control circuit 1411, and semiconductor integrated circuit information 1412 from the outside.

The semiconductor integrated circuit information 1412 is information about a circuit which has the proper function of a semiconductor integrated circuit except circuits added for the test. The memory BIST circuit 1403, logic BIST circuit 1406, and test sequence control circuit 1411 indicate information about circuits to be added for the test. Upon receiving these pieces of information, the test circuit insertion device 1413 generates the information of the circuits to be added and outputs semiconductor integrated circuit information 1414 after insertion of the test circuits. This enables to design the semiconductor integrated circuit of the third embodiment.

As described above, the semiconductor integrated circuits of the first to third embodiments can execute the BIST of a memory or logic circuit having a BIST circuit while suppressing power consumption. The test circuits are added to the input and output of the scan path of the logic BIST and therefore does not affect the system performance.

The semiconductor integrated circuit design apparatus of the fourth embodiment can automatically design a semiconductor integrated circuit including a test circuit capable of minimizing the test time upon receiving design information and test conditions.

The semiconductor integrated circuits and design apparatus of the above embodiments can reduce power consumption during the test.

The above-described embodiments are merely examples and do not limit the present invention. Various changes and modifications can be made without departing from the technical scope of the present invention. For example, in the above embodiments, a memory BIST is executed in addition to the BIST of a logic circuit. However, the present invention is applicable even when the BIST is executed for any circuit other than the memory and logic circuit.

In the above-described embodiments, only one logic circuit is provided as a test target block. However, a plurality of logic circuits may exist. Similarly, in the above-described embodiments, only one memory is provided as a test target block. However, a plurality of memory blocks may exist.

What is claimed is:

1. A semiconductor integrated circuit comprising:
a logic circuit which operates upon receiving a clock;
a logic built-in self test circuit which executes a built-in self test of said logic circuit, said logic built-in self test circuit having a pattern generator which generates a pattern to be input to said logic circuit, a pattern compactor which receives data output from said logic circuit that has received the pattern, compacts the data, and outputs a result, and a logic built-in self test control unit which controls operations of said pattern generator and said pattern compactor and controls an operation of causing a scan path in said logic circuit to shift upon receiving the pattern;
a device circuit which operates upon receiving the clock; and
a device circuit built-in self test circuit which executes a built-in self test of said device circuit,
wherein while said device circuit built-in self test circuit is executing the built-in self test of said device circuit, said logic built-in self test circuit is set in a low power consumption mode, said pattern generator maintains a data holding state immediately before said logic built-in self test circuit is set in the low power consumption mode, generates a fixed value in place of the pattern, and inputs the fixed value to said logic circuit, and said pattern compactor maintains a data holding state immediately before said logic built-in self test circuit is set in the low power consumption mode and stops a compaction operation.

2. The circuit according to claim 1, wherein
said pattern generator comprises:
a plurality of stages of first registers which are arranged in series;
first multiplexers each of which is provided on an input side of a corresponding one of said first registers to select, on the basis of a first control signal, one of an output from the first register arranged on a preceding stage of the corresponding first register and an output from the corresponding first register and output the selected output to an input of the corresponding first register;
first logical operation elements each of which is arranged on an output side of a predetermined one of said plurality of stages of first registers to execute a first logical operation upon receiving an output from a corresponding one of said first registers and an output from the first register of a final stage, and output a first operation result, as the output from the corresponding first register, to the first multiplexer that is provided on an input side of the first register arranged on a succeeding stage of the corresponding first register; and
second logical operation elements each of which is provided in correspondence with one of said first registers to execute a second logical operation upon receiving the first control signal and an output from the corresponding first register and output a second operation result, and
if the first control signal corresponds to the low power consumption mode,
each of said first multiplexers selects the output from the corresponding first register and feeds back the output to the input of the corresponding first register, and
each of said second logical operation elements outputs a fixed value.

3. The circuit according to claim 2, wherein
said logic built-in self test control unit
sets the low power consumption mode when said device circuit built-in self test circuit starts the built-in self test of said device circuit while a built-in self test is being executed by supplying an Nth (N is an integer, $N \geq 1$) pattern to the scan path of said logic circuit,
when setting the low power consumption mode, finishes shift output of the Nth test result pattern existing on the scan path and shift input of a next (N+1)th pattern from/to the scan path of said logic circuit, causes said pattern generator to maintain the data holding state immediately before the low power consumption mode is set and generate the fixed value in place of the pattern, and causes said pattern compactor to maintain the data holding state immediately before the low power consumption mode is set and stop the compaction operation, and
when said device circuit built-in self test circuit finishes the built-in self test of said device circuit, ends the low power consumption mode, causes said pattern generator to generate an (N+2)th pattern next to the (N+1)th pattern and input the (N+2)th pattern to the scan path, and causes said pattern compactor to resume the compaction operation and continuously compact the shift output.

4. The circuit according to claim 2, wherein
said logic built-in self test circuit has at least a first logic built-in self test circuit and a second logic built-in self test circuit,
said logic circuit has a first logic circuit unit which undergoes a built-in self test by at least said first logic built-in self test circuit, and a second logic circuit unit which undergoes a built-in self test by at least said second logic built-in self test circuit,
said device circuit built-in self test circuit has at least a first memory built-in self test circuit and a second memory built-in self test circuit,
said device circuit has a first memory unit which undergoes a built-in self test by at least said first memory built-in self test circuit and a second memory unit which undergoes a built-in self test by at least said second memory built-in self test circuit, and
the circuit further comprises a test sequence control circuit which controls a procedure of a built-in self test operation of each of said first logic built-in self test circuit, said second logic built-in self test circuit, said first memory built-in self test circuit, and said second memory built-in self test circuit,
said test sequence control circuit
setting all logic built-in self test circuits including said first logic built-in self test circuit and said second logic built-in self test circuit in the low power consumption mode, causing said first memory built-in self test circuit to write first data in said first memory unit and start a holding operation and causing said second memory built-in self test circuit and subsequent memory built-in self test circuits to sequentially write the first data in said second memory unit and subsequent memory units and start the holding operation to shift all memory built-in self test circuits to a holding state, ending the low power consumption mode of said first logic built-in self test circuit, causing said first logic built-in self test circuit to execute the built-in self test of said first logic circuit unit, if a holding period of said first memory unit finishes during execution, setting said first logic built-in self test circuit in the low power consumption mode, causing said first memory built-in self test circuit to read out the first data from said first memory unit, causing said second memory built-in self test circuit and subsequent memory built-in self test circuits to sequentially read out the first data from said second memory unit and subsequent memory units, ending a first memory holding test, and executing a first memory holding test and subsequent memory holding tests in accordance with the same procedure, and if a first logic built-in self test finishes during the holding state of the memory holding test, ending the low power consumption mode of said second logic built-in self test circuit, causing said second logic built-in self test circuit to execute the built-in self test of said second logic circuit unit, and sequentially executing all logic built-in self tests.

5. The circuit according to claim 1, wherein
said pattern compactor comprises:
a plurality of stages of second registers which are arranged in series;
second multiplexers each of which is provided on an input side of a corresponding one of said second registers to select, on the basis of a second control signal, one of an output from the second register arranged on a preceding stage of the corresponding second register and an output from the corresponding second register and output the selected output to an input of the corresponding second register; and
third logical operation elements each of which is arranged on an output side of one of said plurality of stages of second registers at a predetermined position to execute a third logical operation upon receiving an output from a corresponding one of said second registers, an output from the second register of a final stage, and a corresponding one of data output from said logic circuit in parallel and output a third operation result, as the output from the corresponding second register, to the second multiplexer that is provided on an input side of the second register arranged on a succeeding stage of the corresponding second register, and
if the second control signal corresponds to the low power consumption mode,
each of said second multiplexers selects the output from the corresponding second register and feeds back the output to the input of the corresponding second register.

6. The circuit according to claim 5, wherein
said logic built-in self test control unit
sets the low power consumption mode when said device circuit built-in self test circuit starts the built-in self test of said device circuit while a built-in self test is being executed by supplying an Nth (N is an integer, N≧1) pattern to the scan path of said logic circuit, when setting the low power consumption mode, finishes shift output of the Nth test result pattern existing on the scan path and shift input of a next (N+1)th pattern from/to the scan path of said logic circuit, causes said pattern generator to maintain the data holding state immediately before the low power consumption mode is set and generate the fixed value in place of the pattern, and causes said pattern compactor to maintain the data holding state immediately before the low power consumption mode is set and stop the compaction operation, and when said device circuit built-in self test circuit finishes the built-in self test of said device circuit, ends the low power consumption mode, causes said pattern generator to generate an (N+2)th pattern next to the (N+1)th pattern and input the (N+2)th pattern to the scan path, and causes said pattern compactor to resume the compaction operation and continuously compact the shift output.

7. The circuit according to claim 5, wherein
said logic built-in self test circuit has at least a first logic built-in self test circuit and a second logic built-in self test circuit,
said logic circuit has a first logic circuit unit which undergoes a built-in self test by at least said first logic built-in self test circuit, and a second logic circuit unit which undergoes a built-in self test by at least said second logic built-in self test circuit,
said device circuit built-in self test circuit has at least a first memory built-in self test circuit and a second memory built-in self test circuit,
said device circuit has a first memory unit which undergoes a built-in self test by at least said first memory built-in self test circuit and a second memory unit which undergoes a built-in self test by at least said second memory built-in self test circuit, and
the circuit further comprises a test sequence control circuit which controls a procedure of a built-in self test operation of each of said first logic built-in self test circuit, said second logic built-in self test circuit, said first memory built-in self test circuit, and said second memory built-in self test circuit,
said test sequence control circuit
setting all logic built-in self test circuits including said first logic built-in self test circuit and said second logic built-in self test circuit in the low power consumption mode,
causing said first memory built-in self test circuit to write first data in said first memory unit and start a holding operation and causing said second memory built-in self test circuit and subsequent memory built-in self test circuits to sequentially write the first data in said second memory unit and subsequent memory units and start the holding operation to shift all memory built-in self test circuits to a holding state,
ending the low power consumption mode of said first logic built-in self test circuit, causing said first logic built-in self test circuit to execute the built-in self test of said first logic circuit unit, if a holding period of said first memory unit finishes during execution, setting said first logic built-in self test circuit in the low power consumption mode, causing said first memory built-in self test circuit to read out the first data from said first memory unit, causing said second memory built-in self test circuit and subsequent memory built-in self test circuits to sequentially read out the first data from said second memory unit and subsequent memory units, ending a first memory holding test, and executing a first memory holding test and subsequent memory holding tests in accordance with the same procedure, and if a first logic built-in self test finishes during the holding state of the memory holding test, ending the low power consumption mode of said second logic built-in self test circuit, causing said second logic built-in self test circuit to execute the built-in self test of said second logic circuit unit, and sequentially executing all logic built-in self tests.

8. The circuit according to claim 1, wherein
said logic built-in self test control unit
sets the low power consumption mode when said device circuit built-in self test circuit starts the built-in self test of said device circuit while a built-in self test is being executed by supplying an Nth (N is an integer, $N \geq 1$) pattern to the scan path of said logic circuit,
when setting the low power consumption mode, finishes shift output of the Nth test result pattern existing on the scan path and shift input of a next (N+1)th pattern from/to the scan path of said logic circuit, causes said pattern generator to maintain the data holding state immediately before the low power consumption mode is set and generate the fixed value in place of the pattern, and causes said pattern compactor to maintain the data holding state immediately before the low power consumption mode is set and stop the compaction operation, and
when said device circuit built-in self test circuit finishes the built-in self test of said device circuit, ends the low power consumption mode, causes said pattern generator to generate an (N+2)th pattern next to the (N+1)th pattern and input the (N+2)th pattern to the scan path, and causes said pattern compactor to resume the compaction operation and continuously compact the shift output.

9. The circuit according to claim 1, wherein
said logic built-in self test circuit has at least a first logic built-in self test circuit and a second logic built-in self test circuit,
said logic circuit has a first logic circuit unit which undergoes a built-in self test by at least said first logic built-in self test circuit, and a second logic circuit unit which undergoes a built-in self test by at least said second logic built-in self test circuit,
said device circuit built-in self test circuit has at least a first memory built-in self test circuit and a second memory built-in self test circuit,
said device circuit has a first memory unit which undergoes a built-in self test by at least said first memory built-in self test circuit and a second memory unit which undergoes a built-in self test by at least said second memory built-in self test circuit, and
the circuit further comprises a test sequence control circuit which controls a procedure of a built-in self test operation of each of said first logic built-in self test circuit, said second logic built-in self test circuit, said first memory built-in self test circuit, and said second memory built-in self test circuit,
said test sequence control circuit
setting all logic built-in self test circuits including said first logic built-in self test circuit and said second logic built-in self test circuit in the low power consumption mode,
causing said first memory built-in self test circuit to write first data in said first memory unit and start a holding operation and causing said second memory built-in self test circuit and subsequent memory built-in self test circuits to sequentially write the first data in said second memory unit and subsequent memory units and start the holding operation to shift all memory built-in self test circuits to a holding state,
ending the low power consumption mode of said first logic built-in self test circuit, causing said first logic built-in self test circuit to execute the built-in self test of said first logic circuit unit, if a holding period of said first memory unit finishes during execution, setting said first logic built-in self test circuit in the low power consumption mode, causing said first memory built-in self test circuit to read out the first data from said first memory unit, causing said second memory built-in self test circuit and subsequent memory built-in self test circuits to sequentially read out the first data from said second memory unit and subsequent memory units, ending a first memory holding test, and executing a first memory holding test and subsequent memory holding tests in accordance with the same procedure, and
if a first logic built-in self test finishes during the holding state of the memory holding test, ending the low power consumption mode of said second logic built-in self test circuit, causing said second logic built-in self test circuit to execute the built-in self test of said second logic circuit unit, and sequentially executing all logic built-in self tests.

10. A semiconductor integrated circuit design apparatus comprising:
a memory built-in self test circuit generation device which generates circuit information of a built-in self test circuit of a memory included in a semiconductor integrated circuit on the basis of configuration information of the memory;
a logic built-in self test circuit generation device which generates circuit information of a built-in self test circuit of a logic circuit included in the semiconductor integrated circuit on the basis of information of the logic circuit;
a test sequence control circuit generation device which generates circuit information of a test sequence control circuit that controls a test sequence so as to satisfy a power consumption condition, on the basis of the circuit information of the memory built-in self test circuit, the circuit information of the logic circuit built-in self test circuit, a test condition of the semiconductor integrated circuit, and the power consumption condition in a test; and
a test circuit insertion device which receives the circuit information of the semiconductor integrated circuit and adds the circuit information of the memory built-in self test circuit, the circuit information of the logic circuit built-in self test circuit, and the circuit information of the test sequence control circuit to the circuit information of the semiconductor integrated circuit, thereby outputting circuit information of the semiconductor integrated circuit in which the memory built-in self test circuit, the logic circuit built-in self test circuit, and the test sequence control circuit are inserted.

11. The apparatus according to claim 10, wherein said test sequence control circuit generation device generates the circuit information of the test sequence control circuit on the basis of first additional information about a name of an element in the memory built-in self test circuit, and presence/absence of a holding function, and second additional information about a name of an element in the logic circuit built-in self test circuit, the number of scan paths, and a length of each scan path, in addition to the circuit information of the memory built-in self test circuit, the circuit information of the logic circuit built-in self test circuit, the test condition of the semiconductor integrated circuit, and the power consumption condition in the test.

12. The apparatus according to claim 10, wherein said logic circuit built-in self test circuit has a pattern generator which generates a pattern to be input to the logic circuit, a pattern compactor which receives data output from the logic circuit that has received the pattern, compacts the data, and outputs a result, and a logic built-in self test control unit which controls operations of the pattern generator and the pattern compactor and controls an operation of causing a scan path in the logic circuit to shift upon receiving the pattern, and while the memory built-in self test circuit is executing the built-in self test of the memory, the logic built-in self test circuit is set in a low power consumption mode, the pattern generator maintains a data holding state immediately before the logic built-in self test circuit is set in the low power consumption mode, generates a fixed value in place of the pattern, and inputs the fixed value to the logic circuit, and the pattern compactor maintains a data holding state immediately before the logic built-in self test circuit is set in the low power consumption mode and stops a compaction operation.

13. The apparatus according to claim 10, wherein the pattern generator comprises:

a plurality of stages of first registers which are arranged in series;

first multiplexers each of which is provided on an input side of a corresponding one of the first registers to select, on the basis of a first control signal, one of an output from the first register arranged on a preceding stage of the corresponding first register and an output from the corresponding first register and output the selected output to an input of the corresponding first register;

first logical operation elements each of which is arranged on an output side of a predetermined one of the plurality of stages of first registers to execute a first logical operation upon receiving an output from a corresponding one of the first registers and an output from the first register of a final stage, and output a first operation result, as the output from the corresponding first register, to the first multiplexer that is provided on an input side of the first register arranged on a succeeding stage of the corresponding first register; and second logical operation elements each of which is provided in correspondence with one of the first registers to execute a second logical operation upon receiving the first control signal and an output from the corresponding first register and output a second operation result, and if the first control signal corresponds to the low power consumption mode, each of the first multiplexers selects the output from the corresponding first register and feeds back the output to the input of the corresponding first register, and each of the second logical operation elements outputs a fixed value.

14. The apparatus according to claim 10, wherein the pattern compactor comprises:

a plurality of stages of second registers which are arranged in series;

second multiplexers each of which is provided on an input side of a corresponding one of the second registers to select, on the basis of a second control signal, one of an output from the second register arranged on a preceding stage of the corresponding second register and an output from the corresponding second register and output the selected output to an input of the corresponding second register; and third logical operation elements each of which is arranged on an output side of one of the plurality of stages of second registers at a predetermined position to execute a third logical operation upon receiving an output from a corresponding one of the second registers, an output from the second register of a final stage, and a corresponding one of data output from the logic circuit in parallel and output a third operation result, as the output from the corresponding second register, to the second multiplexer that is provided on an input side of the second register arranged on a succeeding stage of the corresponding second register, and if the second control signal corresponds to the low power consumption mode, each of the second multiplexers selects the output from the corresponding second register and feeds back the output to the input of the corresponding second register.

15. The apparatus according to claim 10, wherein the logic built-in self test control unit sets the low power consumption mode when the memory built-in self test circuit starts the built-in self test of the memory while a built-in self test is being executed by supplying an Nth (N is an integer, N≧1) pattern to the scan path of the logic circuit, when setting the low power consumption mode, finishes shift output of the Nth test result pattern existing on the scan path and shift input of a next (N+1)th pattern from/to the scan path of the logic circuit, causes the pattern generator to maintain the data holding state immediately before the low power consumption mode is set and generate the fixed value in place of the pattern, and causes the pattern compactor to maintain the data holding state immediately before the low power consumption mode is set and stop the compaction operation, and when the memory built-in self test circuit finishes the built-in self test of the memory, ends the low power consumption mode, causes the pattern generator to generate an (N+2)th pattern next to the (N+1)th pattern and input the (N+2)th pattern to the scan path, and causes the pattern compactor to resume the compaction operation and continuously compact the shift output.

16. The apparatus according to claim 10, wherein the logic built-in self test circuit has at least a first logic built-in self test circuit and a second logic built-in self test circuit, the logic circuit has a first logic circuit unit which undergoes a built-in self test by at least the first logic built-in self test circuit, and a second logic circuit unit which undergoes a built-in self test by at least the second logic built-in self test circuit, the memory built-in self test circuit has at least a first memory built-in self test circuit and a second memory built-in self test circuit, the memory has a first memory unit which undergoes a built-in self test by at least the first memory built-in self test circuit and a second memory unit which undergoes a built-in self test by at least the second memory built-in self test circuit, and the circuit further comprises a test sequence control circuit which controls a procedure of a built-in self test operation of each of the first logic built-in self test circuit, the second logic built-in self test circuit, the first memory built-in self test circuit, and the second memory built-in self test circuit, the test sequence control circuit
setting all logic built-in self test circuits including the first logic built-in self test circuit and the second logic built-in self test circuit in the low power consumption mode,
causing the first memory built-in self test circuit to write first data in the first memory unit and start a holding operation and causing the second memory built-in self test circuit and subsequent memory built-in self test circuits to sequentially write the first data in the second memory unit and subsequent memory units and start the holding operation to shift all memory built-in self test circuits to a holding state,
ending the low power consumption mode of the first logic built-in self test circuit, causing the first logic built-in self test circuit to execute the built-in self test of the first logic circuit unit, if a holding period of the first memory unit finishes during execution, setting the first logic built-in self test circuit in the low power consumption mode, causing the first memory built-in self test circuit to read out the first data from the first memory unit, causing the second memory built-in self test circuit and subsequent memory built-in self test circuits to sequentially read out the first data from the second memory unit and subsequent memory units, ending a first memory holding test, and executing a first memory holding test and subsequent memory holding tests in accordance with the same procedure, and
if a first logic built-in self test finishes during the holding state of the memory holding test, ending the low power consumption mode of the second logic built-in self test circuit, causing the second logic built-in self test circuit to execute the built-in self test of the second logic circuit unit, and sequentially executing all logic built-in self tests.

* * * * *